(12) United States Patent
Ueki

(10) Patent No.: US 6,811,674 B2
(45) Date of Patent: Nov. 2, 2004

(54) PALLADIUM PLATING SOLUTION

(75) Inventor: Shinji Ueki, Tokyo-To (JP)

(73) Assignee: Matsuda Sangyo Co., Ltd., Tokyo-To (JP)

( * ) Notice: Subject to any disclaimer, the term of this patent is extended or adjusted under 35 U.S.C. 154(b) by 0 days.

(21) Appl. No.: 09/946,818

(22) Filed: Sep. 5, 2001

(65) Prior Publication Data

US 2002/0144909 A1 Oct. 10, 2002

(51) Int. Cl.$^7$ .................... C25D 3/50; C23C 28/00; C23C 18/00
(52) U.S. Cl. .............. 205/265; 205/196; 106/1.21; 106/1.28
(58) Field of Search ............... 205/196, 265; 428/544; 106/1.21, 1.28

(56) References Cited

U.S. PATENT DOCUMENTS 4,491,507 A * 1/1985 Herklotz et al. ............. 204/47
4,673,472 A * 6/1987 Morrissey et al. .......... 205/257

FOREIGN PATENT DOCUMENTS

| GB | 2065175 A | * | 6/1981 |
| JP | 2000-077594 | | 3/2000 |
| JP | 2000-096284 | | 4/2000 |

OTHER PUBLICATIONS

Patent Abstract of Japan of JP 2000–096284 dated Apr. 4, 2000.
Patent Abstract of Japan of JP 2000–077594 dated Mar. 14, 2000.

* cited by examiner

*Primary Examiner*—Edna Wong
(74) *Attorney, Agent, or Firm*—Ladas & Parry

(57) ABSTRACT

The present invention provides a palladium plating solution comprising at least 1 to 60 g/L, in terms of the amount of palladium, of a soluble palladium salt and 0.1 to 300 g/L of a sulfamic acid or its salt, the palladium plating solution being substantially free from a brightening agent. This plating solution can be used to form, on a substrate, a palladium plating having on its surface an acicular crystal, and, thus, a plating having excellent adhesion to resin can be provided on the surface of a substrate.

15 Claims, No Drawings

PALLADIUM PLATING SOLUTION

BACKGROUND OF THE INVENTION

1. Field of the Invention

The present invention relates to a palladium plating solution for electroplating. More particularly, the present invention relates to a palladium plating solution which can form a plated surface having good adhesion to resin.

2. Background Art

Palladium plating solutions have hitherto been put to practical use in plating of electrical and electronic components. In recent years, the use of palladium plating solutions is also desired in the field of lead frames. Semiconductor devices using lead frames are generally produced by mounting a semiconductor chip on a lead frame, wire bonding the semiconductor chip in its electrode to the lead frame in its inner lead, covering the circumference of the semiconductor and the wire bonded portion by mold resin, and then cutting off the outer frame of the lead frame. In this case, the front end of the inner lead is previously plated with silver for good wire bonding purposes. Further, the surface of the outer lead is solder plated after the construction of the semiconductor device.

Since, however, solder contains lead, there is a fear of posing problems including the influence of the solder on environment. For this reason, the use of palladium plating as an alternative to solder plating for outer leads of lead frames has drawn attention. Further, the use of palladium plating as an alternative to silver plating for inner leads has also drawn attention.

When palladium plating solutions are used in lead frame applications, in general, excellent adhesion to mold resin, wettability by solder after heat history, ductility, wire bondability, reliability in solder joining, migration resistance, corrosion resistance, and other properties are required of plating solutions.

In particular, when palladium plating solutions are used in lead frame applications, the adhesion to mold resin is important. For this reason, improving the adhesion of palladium plating solutions to mold resin has been desired.

Regarding means for improving the adhesion between palladium plating formed using a palladium plating solution (that is, plated surface) and mold resin, for example, Japanese Patent Laid-Open No. 077594/2000 discloses a method wherein a lead frame material is etched with an acid to form suitable concaves and convexes on the surface of a nickel plating as a substrate, whereby the adhesion between the palladium plating and the mold resin is enhanced by anchor effect attained by the concaves and convexes on the surface of the nickel plating. In this method, however, in addition to the step of plating, the step of previously performing etching should be provided. Therefore, this method is also unsatisfactory from the viewpoints of troublesome treatment and treatment cost. Further, when applications other than lead frames are taken into consideration, roughening of the surface by etching is not always favorable.

On the other hand, unlike plating using palladium plating solutions, regarding plating using copper plating solutions, for example, Japanese Patent Laid-Open No. 096284/2000 discloses that the precipitation of acicular crystal on the surface of plating can improve the adhesion of the plating to resin. So far as the present inventor know, however, the formation of acicular crystals on the surface of a plating in palladium plating has not been reported. Copper plating and palladium plating are utterly different from each other in properties, plating conditions, and mode of use.

SUMMARY OF THE INVENTION

The present inventor have found that, when a palladium plating solution comprising at least a specific amount of a soluble palladium salt and a specific amount of sulfamic acid or its salt and substantially free from a brightening agent is prepared and is used for palladium plating, a palladium plating having an acicular crystal on its surface can be formed. The present invention has been made based on such finding.

Accordingly, it is an object of the present invention to provide a palladium plating solution that can form a palladium plating having on its surface an acicular crystal which has excellent adhesion to resin.

According to one aspect of the present invention, there is provided a palladium plating solution comprising at least 1 to 60 g/L, in terms of the amount of palladium, of a soluble palladium salt and 0.1 to 300 g/L of a sulfamic acid or its salt, said palladium plating solution being substantially free from a brightening agent.

According to another aspect of the present invention, there is provided a method for palladium plating, comprising the steps of: providing a plating bath using the above palladium plating solution; and then electroplating a substrate in the plating bath under conditions of bath temperature 30 to 70° C. and cathode current density 0.2 to 20 A/dm$^2$ to form, on the substrate, a plating having on its surface an acicular crystal.

According to a further aspect of the present invention, there is provided a palladium-plated product produced by electroplating a substrate using the above palladium plating solution.

Plating treatment using the palladium plating solution according to the present invention can form a plating having on its surface an acicular crystal. The formation of this plating can be expected to offer anchor effect. Therefore, the plating has better adhesion to resin than a plating having a glossy surface. In this case, in general, the appearance of the plating is substantially dull because the acicular crystal microscopically constitutes the surface of the plating. Further, plated products produced by a combination of the formed plating with resin have good adhesion between the plating and the resin and thus can maintain stable properties for a long period of time. Further, the palladium plating solution according to the present invention has excellent service life and good current efficiency. Therefore, the palladium plating solution according to the present invention can be suitably used as a plating solution for lead frames.

DETAILED DESCRIPTION OF THE INVENTION

Palladium Plating Solution

The palladium plating solution according to the present invention comprises at least a specific amount of a soluble palladium salt and a specific amount of sulfamic acid or its salt and is substantially free from a brightening agent. The palladium plating solution is generally used in electroplating.

Here "brightening agent" refers to an additive, which is added to plating solutions, for imparting a gloss to the plated face. In general, the brightening agent refers to inorganic and organic additives which can level the surface of a plating. The brightening agent referred to herein is any brightening agent commonly used in the art, and examples thereof include: the so-called primary brightening agents, such as saccharin, sodium benzenesulfonate, benzenesulfonamide, phenolsulfonic acid, and methylenebis(naphthalene)sulfonic acid; and the so-called secondary brightening agents, such as 2-butyne-1,4-diol, benzaldehyde-O-sodium sulfonate, 2-butene-1,4-diol, and allyl sulfonate.

By virtue of a specific composition, the plating solution according to the present invention can form a plating having on its surface an acicular crystal, and the presence of the acicular crystal on the surface of the plating renders the appearance of the plating substantially dull. Therefore, that the plating solution is substantially free from a brightening agent is considered advantageous in the formation of a dull surface, i.e., a surface constituted by an acicular crystal. Accordingly, the plating solution according to the present invention is also characterized in that the plating solution is substantially free from a brightening agent. Here "substantially free from a brightening agent" of course embraces that the plating solution does not contain the above brightening agent, and also embraces that the plating solution contains the brightening agent in such an amount that cannot function as a brightening agent.

Preferably, the palladium plating solution according to the present invention further comprises a conductive compound. Further, if necessary, the palladium plating solution according to the present invention may further comprise optional ingredients other than the above brightening agents.

Soluble Palladium Salt

In the present invention, any soluble palladium salt may be used without particular limitation so far as the palladium salt is soluble in the plating solution and can supply palladium ions to the plating solution. Examples of soluble palladium salts usable herein include ammine complex salts, nitrates, and chlorides of palladium.

Among them, suitable ammine complex salts of palladium include chlorides, bromides, iodides, nitrites, nitrates, and sulfates of palladium ammine complex salts. Preferred ammine complex salts include diammine complex salts and tetraammine complex salts.

Accordingly, specific examples thereof include dichlorotetraamminepalladium $(Pd(NH_3)_4Cl_2)$, dibromotetraamminepalladium $(Pd(NH_3)_4Br_2)$, tetraamminepalladium diiodide $(Pd(NH_3)_4I_2)$, tetraamminepalladium dinitrite $(Pd(NH_3)_4(ONO)_2)$, tetraamminepalladium dinitrate $(Pd(NH_3)_4(NO_3)_2)$, tetraamminepalladium disulfite $(Pd(NH_3)_4(SO_3)_2)$, tetraamminepalladium disulfate $(Pd(NH_3)_4(SO_4)_2)$, dinitrotetraamminepalladium $(Pd(NH_3)_4(NO_2)_2)$, dichlorodiamminepalladium $(Pd(NH_3)_2Cl_2)$, dibromodiamminepalladium $(Pd(NH_3)_2Br_2)$, diamminepalladium diiodide $(Pd(NH_3)_2I_2)$, diamminepalladium dinitrite $(Pd(NH_3)_2(ONO)_2)$, diamminepalladium dinitrate $(Pd(NH_3)_2(NO_3)_2)$, diamminepalladium disulfite $(Pd(NH_3)_2(SO_3)_2)$, diamminepalladium disulfate $(Pd(NH_3)_2(SO_4)_2)$, and dinitrodiamminepalladium $(Pd(NH_3)_2(NO_2)_2)$. These salts may be synthesized, or alternatively, commercially available products may be used.

According to a more preferred embodiment of the present invention, the soluble palladium salt is dichlorotetraamminepalladium $(Pd(NH_3)_4Cl_2)$, tetraamminepalladium dinitrite $(Pd(NH_3)_4(ONO)_2)$, tetraamminepalladium dinitrate $(Pd(NH_3)_4(NO_3)_2)$, dinitrotetraamminepalladium $(Pd(NH_3)_4(NO_2)_2)$ dichlorodiamminepalladium $(Pd(NH_3)_2Cl_2)$, diamminepalladium dinitrite $(Pd(NH_3)_2(ONO)_2)$, diamminepalladium dinitrate $(Pd(NH_3)_2(NO_3)_2)$, or dinitrodiamminepalladium $(Pd(NH_3)_2(NO_2)_2)$.

They may be used alone or in a combination of two or more.

In the present invention, the plating solution contains the soluble palladium salt in an amount of 1 to 60 g/L, preferably 2 to 20 g/L, in terms of the amount of palladium.

Here, for example, "1 to 60 g/L, in terms of the amount of palladium, of a soluble palladium salt" refers to an amount of the soluble palladium salt such that the amount of palladium (Pd) in the plating solution prepared is 1 to 60 g/L.

Sulfamic Acid or Its Salt

The palladium plating solution according to the present invention comprises, as an indispensable ingredient, sulfamic acid or its salt.

In the present invention, the salt of sulfamic acid is not particularly limited so far as the salt can supply sulfamic acid to the plating solution and does not affect the electric conductivity of the plating solution. Examples thereof include alkali metal salts of sulfamic acid, alkaline earth metal salts of sulfamic acid, and an ammonium salt of sulfamic acid. More specifically, for example, sodium sulfamate, potassium sulfamate, ammonium sulfamate, and calcium sulfamate are suitable as the salt of sulfamic acid. They may be used alone or in a combination of two or more.

According to the present invention, sulfamic acid or its salt is incorporated, into the plating solution, in an amount of 0.1 to 300 g/L, preferably 1 to 200 g/L, more preferably 1 to 100 g/L.

Conductive Compound

The palladium plating solution according to the present invention preferably further comprises a conductive compound. In the present invention, the conductive compound is added for improving the electric conductivity of the plating solution and plating efficiency, and is not particularly limited so far as the conductive compound is not detrimental to the plating treatment. Examples of conductive compounds usable herein include various simple salts, strong acids, and strong bases. Compounds, which form by-products having adverse effect on properties upon electrolysis, are unfavorable as the conductive compound used in the present invention. The plating solution according to the present invention has stable properties for a long period of time.

In the present invention, the conductive compound is preferably a salt selected from the group consisting of, for example, nitrates, chlorides, sulfates, phosphates, oxalates, hydroxides, borates, tartrates, and carbonates. Specific examples of such conductive compounds include: nitrates, such as ammonium nitrate, potassium nitrate, and sodium nitrate; chlorides, such as ammonium chloride, potassium chloride, and sodium chloride; sulfates, such as ammonium sulfate, potassium sulfate, and sodium sulfate; phosphates, such as ammonium phosphate, potassium phosphate, and sodium phosphate; oxalates, such as ammonium oxalate, potassium oxalate, and sodium oxalate; tartrates, such as ammonium tartrate, potassium tartrate, and sodium tartrate; hydroxides, such as ammonium hydroxide, potassium hydroxide, and sodium hydroxide; borates, such as ammonium borate, potassium borate, and sodium borate; and carbonates, such as ammonium carbonate, potassium carbonate, and sodium carbonate.

These salts may be used alone or in a combination of two or more.

In the present invention, the conductive compound is preferably incorporated, into the plating solution, in an amount of 0.1 to 500 g/L, more preferably 20 to 400 g/L, still more preferably 40 to 200 g/L.

Other Optional Ingredients

If necessary, the plating solution according to the present invention may further comprise other optional ingredients.

Other optional ingredients usable herein include, for example, pH adjustors, buffering agents, surfactants, surface conditioning agents, complexing agents, and dispersants.

The palladium plating solution according to the present invention may further comprise a pH adjustor for adjusting pH of the plating solution. The pH adjustor may be properly added either at the time of the preparation of the plating solution or in the course of plating treatment. The pH value of the palladium plating solution according to the present invention is generally adjusted to 6 to 9, preferably 6.5 to 8.

In the present invention, any pH adjustor may be used without particular limitation so far as the pH adjustor can adjust pH of the plating solution. Suitable pH adjustors include, for example, aqueous ammonia, dilute sulfuric acid, dilute hydrochloric acid, and dilute nitric acid.

Further, the plating solution according to the present invention may further comprise a buffering agent for maintaining the plating solution in a given pH range. Any buffering agent may be used without particular limitation and may be properly selected from conventional buffering agents so far as the buffering agent does not affect other ingredients contained in the plating solution, such as a palladium salt, a salt of sulfamic acid, and a conductive compound.

Further, the plating solution according to the present invention may further comprise a surfactant. Surfactants usable herein include conventional nonionic surfactants and cationic surfactants.

Examples of surface conditioning agents include: organic compounds having OH group, for example, alcohols, such as ethanol, butanediol, glycerin, and ethyl cellosolve, glucose, sucrose, starch, and isomerized sugar which is a mixture of glucose with fruit sugar; organic compounds having CHO group, such as acetaldehyde and formaldehyde; organic compounds having CO group, such as acetone, pinacoline, mesityl oxide, acetophenone, and cyclohexanone; and organic compounds having N, for example, amines, such as methylamine, triethanolamine, pyridine, and bipyridine.

Plating Treatment

In performing electroplating treatment using the palladium plating solution according to the present invention, as described above, the plating solution is typically adjusted to a pH value in the range of 6 to 9, preferably in the range of 6.5 to 8. Further, in the plating treatment, the temperature of the plating solution is typically brought to 30 to 70° C., preferably 45 to 65° C.

The cathode current density in the plating treatment is typically 0.2 to 20 A/dm$^2$, preferably 1 to 10 A/dm$^2$.

The thickness of the palladium plating formed is not particularly limited, and may vary, for example, depending upon current density and plating time.

In the plating treatment using the palladium plating solution according to the present invention, a conventional plating treatment method may be if necessary applied. For example, the plating treatment may be carried out while properly stirring the plating solution. Further, if necessary, the filtration of the plating solution may be carried out simultaneously with the plating treatment or before or after the plating treatment. When the concentration of palladium in the plating solution is lowered with the progress of the plating treatment, only the soluble palladium salt component may be added to the plating solution followed by continuation of the plating treatment.

Substrates to be plated using the palladium plating solution according to the present invention include, for example, lead frame materials and connector substrates, and typical substrates are lead frame materials.

The lead frame may be formed of any material, which is used in semiconductor devices, without particular limitation. Examples of materials include copper alloys, iron-nickel alloys, and clad metals. Plating on lead frame materials refers to plating on any of outer leads and inner leads in lead frame materials. Connector substrates usable herein include, but are not particularly limited to, for example, connector substrates formed of copper or copper alloys for use in semiconductor related products.

According to another aspect of the present invention, there is provided a method for palladium plating, comprising the steps of: providing a plating bath using the above palladium plating solution; and then electroplating a substrate in the plating bath under conditions of bath temperature 30 to 70° C. and cathode current density 0.2 to 20 A/dm$^2$ to form, on the substrate, a plating having on its surface an acicular crystal.

According to a further aspect of the present invention, there is provided a palladium-plated product produced by electroplating a substrate using the above palladium plating solution. Preferably, this plated product is produced by the above plating method.

According to a still further aspect of the present invention, there is provided a process for producing a palladium-plated product, comprising the steps of: providing a plating bath using the above palladium plating solution; electroplating a substrate in the plating bath under conditions of bath temperature 30 to 70° C. and cathode current density 0.2 to 20 A/dm$^2$ to form, on the substrate, a plating having on its surface an acicular crystal; and then covering the plating having an acicular crystal surface by a mold resin.

Mold resins usable herein include, for example, epoxy resin (for example, novolak type epoxy resin) and silicone resin.

The step of covering the plated surface by the mold resin may be properly carried out by applying conventional means known to a person having ordinary skill in the art.

These resins are highly compatible with the plating having an acicular-crystal surface and, in addition, can be expected to have anchor effect which can enhance the adhesion to the plated surface. This is advantageous from the viewpoint of providing highly stable plated products.

EXAMPLES

The present invention will be described in more detail with reference to the following examples, though it is not limited to these examples only.

Example 1

Palladium plating solution 1 having the following composition was prepared. The temperature of the plating solution was brought to 55° C.

| Palladium plating solution 1: | |
| --- | --- |
| Dichlorotetraammineplatinum | 2 g/L (in terms of the amount of palladium) |
| Sodium sulfamate | 100 g/L |

The plating solution was adjusted to pH 7 by the addition of ammonium hydroxide or dilute sulfuric acid.

A hull cell copper plate (available from YAMAMOTO-MS CO., LTD.) was provided as a test substrate, and dull nickel (Ni) plating treatment was previously carried out to a thickness of 1 μm by conventional means. This substrate was then plated in the palladium plating solution bath while stirring the plating solution at a current density of 3.5 A/dm² for 10 sec to form a plating. This was used as plating sample 1.

Example 2

Palladium plating solution 2 having the following composition was prepared. The temperature of the plating solution was brought to 55° C.

| Palladium plating solution 2: | | |
|---|---|---|
| Dinitrotetraamminepalladium | 20 g/L | (in terms of the amount of palladium) |
| Ammonium sulfamate | 50 g/L | |

The plating solution was adjusted to pH 7 by the addition of ammonium hydroxide or dilute sulfuric acid.

Next, plating treatment was carried out in the same manner as in Example 1, except that this plating solution was used. Thus, plating sample 2 was prepared.

Example 3

Palladium plating solution 3 having the following composition was prepared. The temperature of the plating solution was brought to 55° C.

| Palladium plating solution 3: | | |
|---|---|---|
| Dichlorotetraamminepalladium | 2 g/L | (in terms of the amount of palladium) |
| Sodium sulfamate | 100 g/L | |
| Sodium nitrate | 400 g/L | |

The plating solution was adjusted to pH 7 by the addition of ammonium hydroxide or dilute sulfuric acid.

Next, plating treatment was carried out in the same manner as in Example 1, except that this plating solution was used. Thus, plating sample 3 was prepared.

Example 4

Palladium plating solution 4 having the following composition was prepared. The temperature of the plating solution was brought to 55° C.

| Palladium plating solution 4: | | |
|---|---|---|
| Dinitrotetraamminepalladium | 20 g/L | (in terms of the amount of palladium) |
| Ammonium sulfamate | 50 g/L | |
| Ammonium sulfate | 100 g/L | |

The plating solution was adjusted to pH 7 by the addition of ammonium hydroxide or dilute sulfuric acid.

Next, plating treatment was carried out in the same manner as in Example 1, except that this plating solution was used. Thus, plating sample 4 was prepared.

Example 5 (Comparative)

Palladium plating solution 5 having the following composition was prepared. The temperature of the plating solution was brought to 55° C.

| Palladium plating solution 5: | | |
|---|---|---|
| Dichlorotetraamminepalladium | 2 g/L | (in terms of the amount of palladium) |
| Sodium sulfamate | 100 g/L | |
| Pyridine-3-sulfonic acid | 10 g/L | |

The plating solution was adjusted to pH 7 by the addition of ammonium hydroxide or dilute sulfuric acid.

Next, plating treatment was carried out in the same manner as in Example 1, except that this plating solution was used. Thus, plating sample 5 was prepared.

Example 6 (Comparative)

Palladium plating solution 6 having the following composition was prepared. The temperature of the plating solution was brought to 55° C.

| Palladium plating solution 6: | | |
|---|---|---|
| Dinitrotetraamminepalladium | 20 g/L | (in terms of the amount of palladium) |
| Ammonium sulfamate | 50 g/L | |
| Ammonium sulfate | 100 g/L | |
| Potassium sulfite | 20 g/L | |

The plating solution was adjusted to pH 7 by the addition of ammonium hydroxide or dilute sulfuric acid.

Next, plating treatment was carried out in the same manner as in Example 1, except that this plating solution was used. Thus, plating sample 6 was prepared.

Example 7 (Comparative)

A lead frame was degreased and was pickled with 100 g/L of ammonium persulfate (i.e., step of acid etching). Thereafter, a 0.8 µm-thick nickel plating was formed. Further, a 0.1 µm-thick palladium plating was formed thereto to prepare plating sample 7.

Evaluation Test

The following evaluation tests 1 to 4 were carried out for the palladium plating solutions 1 to 6 and the plating samples 1 to 7.

Evaluation Test 1: Current Efficiency

A 0.9 µm-thick palladium plating was formed under conditions of solution temperature 55° C., current density 3.5 A/dm², and plating time one min. In this case, a difference in weight of the sample between before plating and after plating was measured to determine the amount of palladium plating. The amount of the palladium plating was divided by the theoretical amount of electrodeposition of palladium under the above conditions to determine current efficiency (percentage) which was then evaluated according to the following criteria.

A: Current efficiency of not less than 90%

B: Current efficiency of less than 90%

Evaluation Test 2: Appearance of Plating

The surface of each plating sample was visually inspected according to the so-called "hull cell testing method" (see, for example, "ELECTORDEPOSITION," pp. 217-220, NOYES PUBLICATIONS) to evaluate the state of gloss of the plated surface. In this case, when the plated surface of the sample was not glossy, the plated surface was evaluated as "dull," while, when the glossiness was higher than the dull state, the plated surface was evaluated as "semi-gloss."

Evaluation Test 3: State of Plated Surface

The plated surface of each plating sample was observed under a scanning electron microscope (SEM) (JSM-5600 LV, manufactured by Japan Electric Optical Laboratory) (measuring conditions: magnification 10,000 times) to evaluate the state of the plated surface. When an acicular crystal was found on the plated surface, the state of the plated surface was regarded as "acicular crystal," while, when a layered crystal was found, the state of the plated surface was regarded as "layered crystal." For the sample 7, any crystal was not found on the plated surface, and the surface had concaves and convexes.

Evaluation Test 4: Service Life of Plating Solution

A given amount (one liter) of each of the prepared palladium plating solutions was provided as test plating bathes. These test plating bathes were used to perform plating treatment until palladium contained in the unit volume of the plating solution was completely consumed. In this case, a series of operations, which start with plating and end with the disappearance of palladium in the plating solution, were counted as one turn.

Upon the completion of the turn, only the palladium component was further added to the used plating solution. At that time, any supplementation of the plating solution was not carried out except that the palladium component was added. Subsequently, until palladium contained in the plating solution was completely consumed, plating treatment was again carried out for next one turn.

These procedures were continued until it became difficult to continue plating treatment, for example, due to a change in properties of the plating solution. In this case, for each plating solution, the number of turns, by which plating could be carried out, was counted.

Based on data on the number of turns obtained for each of the plating solutions, the service life of the plating solutions was evaluated according to the following criteria. In the evaluation criteria, when the number of turns is higher, the plating solution is less likely to deteriorate during use for a long period of time.

A: The number of turns by which plating is possible was not less than 10.

B: The number of turns by which plating is possible was less than 10.

Results of Evaluation

The results of evaluation tests were as summarized in Table 1.

In the observation of the plated surface, for platings using the plating solutions according to the present invention, an acicular crystal was found on the plated surface. Further, in this case, the formed platings had good adhesion to resin.

TABLE 1

| Example | Appearance of plating | Current efficiency | State of plated surface | Service life of plating solution |
|---|---|---|---|---|
| 1 | Dull | A | Acicular crystal | A |
| 2 | Dull | A | Acicular crystal | A |
| 3 | Dull | A | Acicular crystal | A |
| 4 | Dull | A | Acicular crystal | A |
| 5 (Comp.) | Semi-gloss | A | Layered crystal | B |
| 6 (Comp.) | Semi-gloss | A | Layered crystal | A |

TABLE 1-continued

| Example | Appearance of plating | Current efficiency | State of plated surface | Service life of plating solution |
|---|---|---|---|---|
| 7 (Comp.) | Dull | A | Concave-convex form (non-crystalline) | — |

What is claimed is:

1. A palladium plating solution comprising 1 to 60 g/L, in terms of the amount of palladium, of a soluble palladium salt and 0.1 to 300 g/L of a sulfamic acid or its salt, said palladium plating solution being substantially free from a brightening agent, and wherein the soluble palladium salt is selected from the group consisting of dichlorotetraamminepalladium ($Pd(NH_3)_4Cl_2$), tetraamminepalladium diiodide ($Pd(NH_3)_4I_2$), tetraamminepalladium dinitrite ($Pd(NH_3)_4(ONO)_2$), tetraamminepalladium dinitrate ($Pd(NH_3)_4(NO_3)_2$), tetraamminepalladium disulfite ($Pd(NH_3)_4(SO_3)_2$), tetraamminepalladium disulfate ($Pd(NH_3)_4(SO_4)_2$), and dinitrotetraamminepalladium ($Pd(NH_3)_4(NO_2)_2$).

2. The palladium plating solution according to claim 1, wherein the salt of sulfamic acid is selected from the group consisting of alkali metal salts of sulfamic acid, alkaline earth metal salts of sulfamic acid, and an ammonium salt of sulfamic acid.

3. The palladium plating solution according to claim 2, which further comprises a conductive compound in an amount of 0.1 to 500 g/L.

4. The palladium plating solution according to claim 1, which further comprises a conductive compound in an amount of 0.1 to 500 g/L.

5. The palladium plating solution according to claim 4, wherein the conductive compound is selected from the group consisting of nitrates, chlorides, sulfates, phosphates, oxalates, hydroxides, boric acid, borates, tartrates, and carbonates.

6. A method for palladium plating, comprising the steps of: providing a plating bath using the palladium plating solution according to claim 1, and electroplating a substrate in the plating bath under conditions of bath temperature of 30° C. to 70° C. and cathode current density of 0.2 $A/dm^2$ to 20 $A/dm^2$ to form, on the substrate, a plating having on its surface an acicular crystal.

7. The method according to claim 6, wherein the substrate is a lead frame material or a connector substrate.

8. The method according to claim 6, wherein the palladium plating solution used further comprises a conductive compound in an amount of 0.1 to 500 g/L.

9. A process for producing a palladium-plated product, comprising the steps of:

providing a plating bath using the palladium plating solution according to claim 1;

electroplating a substrate in the plating bath under conditions of bath temperature of 30° C. to 70° C. and cathode current density of 0.2 $A/dm^2$ to 20 $A/dm^2$ to form, on the substrate, a plating having on its surface an acicular crystal; and covering the plating having an acicular crystal surface by a mold resin.

10. The process according to claim 9, wherein the palladium plating solution used further comprises a conductive compound in an amount of 0.1 to 500 g/L.

11. The palladium plating solution according to claim 1, wherein the soluble palladium salt is selected from the group consisting of dichlorotetraamminepalladium ($Pd(NH_3)_4Cl_2$), tetraamminepalladium dinitrite ($Pd(NH_3)_4(ONO)_2$), tetraamminepalladium dinitrate ($Pd(NH_3)_4(NO_3)_2$), and dinitrotetraamminepalladium ($Pd(NH_3)_4(NO_2)_2$).

12. The palladium plating solution according to claim 1, wherein the soluble palladium salt is selected from the group consisting of dichlorotetraamminepalladium ($Pd(NH_3)_4Cl_2$) and dinitrotetraamminepalladium ($Pd(NH_3)_4(NO_2)_2$), the salt of sulfamic acid is selected from the group consisting of sodium sulfamate and ammonium sulfamate, and wherein the palladium plating solution further comprises a conductive compound selected from the group consisting of nitrates and chlorides.

13. A process for forming a plated surface having an acicular crystal, comprising the steps of:

providing a plating bath using a palladium plating solution, wherein the palladium plating solution comprises 1 to 60 g/L, in terms of the amount of palladium, of a soluble palladium salt and 0.1 to 300 g/L of a sulfamic acid or its salt, said palladium plating solution being substantially free from a brightening agent; and electroplating a substrate in the plating bath to form, on the substrate, a plated surface having an acicular crystal, wherein, the soluble palladium salt is selected from the group consisting of dichlorotetraamminepalladium ($Pd(NH_3)_4Cl_2$), tetraamminepalladium diiodide ($Pd(NH_3)_4I_2$), tetraamminepalladium dinitrite ($Pd(NH_3)_4(ONO)_2$), tetraamminepalladium dinitrate ($Pd(NH_3)_4(NO_3)_2$), tetraamminepalladium disulfite ($Pd(NH_3)_4(SO_3)_2$), tetraamminepalladium disulfate ($Pd(NH_3)_4(SO_4)_2$), and dinitrotetraamminepalladium ($Pd(NH_3)_4(NO_2)_2$).

14. The process according to claim 13, wherein the electroplating is carried out under conditions of bath temperature of 30°C. to 70°C. and cathode current density of 0.2 A/dm$_2$ to 20 A/dm$_2$.

15. The process according to claim 13, wherein the soluble palladium salt is selected from the group consisting of dichlorotetraamminepalladium ($Pd(NH_3)_4Cl_2$) and dinitrotetraamminepalladium ($Pd(NH_3)_4(NO_2)_2$), the salt of sulfamic acid is selected from the group consisting of sodium sulfamate and ammonium sulfamate, and wherein the palladium plating solution further comprises a conductive compound selected from the group consisting of nitrates and chlorides.

* * * * *